United States Patent [19]

Miller et al.

[11] Patent Number: 4,654,121

[45] Date of Patent: Mar. 31, 1987

[54] FABRICATION PROCESS FOR ALIGNED AND STACKED CMOS DEVICES

[75] Inventors: Gayle W. Miller; Nicholas J. Szluk; William W. McKinley; Hubert O. Hayworth; George Maheras, all of Fort Collins, Colo.

[73] Assignee: NCR Corporation, Dayton, Ohio

[21] Appl. No.: 833,686

[22] Filed: Feb. 27, 1986

[51] Int. Cl.⁴ .................. B44C 1/22; H01L 21/22; H01L 27/02; C03C 15/00

[52] U.S. Cl. ................................. 156/653; 148/1.5; 148/187; 148/191; 29/571; 29/576 B; 29/576 W; 29/591; 156/657; 156/659.1; 156/668; 357/23.11; 357/41; 357/59; 357/91

[58] Field of Search ............... 29/571, 576 B, 576 W, 29/580, 578, 591; 156/653, 657, 662, 659.1, 668, 602; 148/1.5, 187, 191; 357/23.1, 23.6, 23.11, 41, 49, 59, 91

[56] References Cited

U.S. PATENT DOCUMENTS 4,514,233  4/1985  Kawabuchi ........................ 29/571 X
4,545,852 10/1985  Barton ............................. 156/652 X
4,603,468  8/1986  Lam ................................. 29/571

OTHER PUBLICATIONS

Hite et al., "Process and Performance Comparison of an 8K×8-Bit SRAM in Three Stacked CMOS Technologies", IEEE, Oct. 1985, 548-50.

Primary Examiner—William A. Powell
Attorney, Agent, or Firm—Wilbert Hawk, Jr.; Casimer K. Salys

[57] ABSTRACT

A process for fabricating aligned, stacked CMOS devices. Following the formation of the lower FET device, conformal undoped and doped oxide layers are formed thereover so that the level of the upper surface of the common gate electrode is above the doped oxide as formed in the source and drain regions of the lower FET device. A planarizing photoresist is then deposited and etched in conjunction with the oxide to the upper surface of the gate electrode. The exposed gate electrode is covered with a gate oxide layer, and a polycrystalline silicon layer for recrystallization to an upper FET device. Updiffusion from the residuals of doped oxide then creates an upper FET device with source and drain regions aligned to the gate oxide thereof and the underlying common gate electrode.

10 Claims, 5 Drawing Figures

FABRICATION PROCESS FOR ALIGNED AND STACKED CMOS DEVICES

BACKGROUND OF THE INVENTION

The present invention relates to three dimensional metal oxide semiconductor (MOS) technology and, in particular, to vertically integrated or "stacked" CMOS-FET structures.

Two of the continuing goals of the microelectronics industry are to increase device packing densities and to enhance performance characteristics such as the speed of operation. The ongoing attempts to scale devices and associated structures have been successful to date in reducing the size and relative spacing between active devices, conductive paths and regions of isolating dielectric, but with some resulting problems caused by, for example, difficulties in photolithographic resolution and device interaction.

Another way to increase MOS device density, besides scaling per se, involves vertical integration, in which devices are stacked one above the other. This approach has significant potential for increased device packing density. In addition, in CMOS technology, the stacked structure can eliminate p-wells, decrease the latch-up phenomenon and provide decreased wire routing complexity.

There are a number of approaches for configuring such stacked MOSFETS For example, a separate gate, stacked CMOS configuration is described in Kawamura et al., "Three-Dimensional CMOS ICs Fabricated Using Beam Recrystallization", *IEEE Electron Device Letters*, Vol. 4, No. 10, pp. 366–368, 1983. As shown in FIG. 2, this stacked device 26 includes two "upright" transistors, that is, two non-inverted PMOS and NMOS transistors 27 and 28 which have separate gates 29 and 30 as well as separate source-channel-drain structures 31 and 32. The lower, PMOS device 27 is apparently formed using standard silicon technology; then a double layer of phosphosilicate glass (PSG) 33 and nitride 34 is formed as the intermediate insulation layer between the stacked devices. The function of the double insulation layer is to minimize surface undulation and to decrease optical reflection during laser irradiation of the polysilicon channel structure 32. Apparently, the NMOS transistor 28 is formed over the PMOS transistor 27 by depositing a second layer of polysilicon (gate 29 is the first poly layer), which is recrystallized and selectively doped to form the NMOS source-channel-drain structure 32, then depositing a third layer of poly and forming it into the NMOS gate 30.

A vertically and horizontally integrated structure is described in Gibbons et al., "Stacked MOSFETs in a Single Film of Laser-Recrystallized Polysilicon," *IEEE Electron Device Letters*, Vol. 3, p. 191, 1982. In this structure, two transistors are provided in a cross-shaped single gate configuration. The paired opposite ends of the cross form the source and drain of the two transistors. The upper and lower surfaces of the polysilicon layer at the junctive of the cross serve as the gates for the two transistors.

Stacked CMOS structures which use a single common gate and recrystallized polysilicon for the upper source-channel-drain structure are also described in Chen et al., "Stacked CMOS SRAM Cell," *IEEE Electron Device Letters*, Vol. 4, p. 272, 1983; and in Colinge et al., "Stacked Transistors CMOS (ST-MOS), an NMOS Technology Modified to CMOS," *IEEE Transactions on Electron Devices*, Vol. ED-29, No. 4, pp. 585–589, April 1982. Colinge et al. discloses a stacked, common gate CMOS inverter which comprises a conventional lower field effect transistor and an upper PMOS field effect transistor. Colinge et al. uses standard poly NMOS processing to form the lower device. That is, source, drain and self-aligned gate electrode 85 (poly I) are formed in and on the substrate. Then there is added a selectively implanted and laser recrystallized polycrystalline silicon layer, which forms the PMOS source, channel and drain. The PMOS drain contacts the NMOS drain to provide an inverter configuration.

Reviewing the relevant part of the Colinge et al. process in greater detail, after forming the NMOS device, the common gate is oxidized and etched to smooth the upper surface for the formation of the second gate oxide. The PMOS gate oxide is then grown on top of the common gate and the second poly layer (poly II) is deposited and implanted to adjust the threshold voltage of the upper PMOS device. The poly II layer is then selectively capped with an antireflective silicon nitride coating and is recrystallized using a CW argon laser. Subsequently, the poly II channel is masked and the source/drain regions are doped p-type by boron implantation. The structure is then completed by the standard sequence of poly II patterning, oxide caping, contact cuts, aluminum deposition and metal patterning.

It should be noted that the source-channel-drain structure of the upper PMOS device is not self-aligned with the common gate. Consequently, the alignment of the p+ source-drain implant mask is critical to minimize capacitive coupling between the source/drain regions and the gate electrode.

Finally, Pashley U.S. Pat. No. 4,272,880, discloses a stacked, common gate MOSFET inverter in which the source-channel-drain structure of a lower NMOS device is formed in an epi layer and the source-channel-drain structure of the PMOS device is formed in a layer of recrystallized polysilicon. The totally self-aligned nonplanar process patterned nitride as an etch mask to define the common gate, then uses the same mask as an implant mask in forming the n-type source and drain. Thereafter, the upper part of the epi layer is oxidized to form an isolation layer over the n-type source and drain with the nitride being retained to mask an underlying gate oxide layer during a p-type implant of the isolation oxide surface. Subsequently, the p-type source and drain are formed by updiffusion from the doped oxide surface so that they are aligned with the common gate.

In short, the Pashley process uses the nitride in accordance with standard silicon self-alignment techniques to patterning and implanting the lower NMOS transistor, then retains the nitride and uses it as a dopant implant mask for the isolation oxide surface so that the p-type source and drain are aligned with the common gate by updiffusion.

SUMMARY OF THE INVENTION

In view of the above discussion, it is one object of the present invention to extend the above-described three dimensional stacked device technology to provide a fully planarized, fully aligned, stacked common gate MOSFET structure.

It is another object of the present invention to provide a unique process sequence for fabricating the above structure, in which the gate oxide of the upper device and the aligned source and drain of the upper device are defined during the process of planarizing the interlevel dielectric which separates the upper and lower devices. This approach eliminates one or more masking operations and minimizes the gate overlap or Miller capacitance in the stacked structure.

In one aspect, the present invention relates to a process for forming a fully aligned stacked MOSFET device pair in which the lower self-aligned device is formed by silicon gate technology and the aligned upper device is formed by the unique fabrication sequence of defining doped regions at the sides of the common gate electrode by the process of planarizing the interlayer dielectric between the devices, then forming source and drain regions in the overlying polycrystalline silicon channel layer by updiffusion from the doped region.

In another more specific aspect, the present invention relates to a process for forming a common gate, stacked, totally aligned MOSFET device pair in which the bottom NMOS FET is formed by conventional self-aligned silicon process techniques. An interlayer dielectric is formed between the devices and over the common gate and contains doped regions at the sides of the common gate. Planarizing techniques are then applied to level the interlayer dielectric and expose the upper surface of the gate electrode. The gate oxide for the upper device is then automatically grown self-aligned, that is, precisely delineated on, the upper electrode. A polysilicon layer is defined over the interlayer dielectric and gate oxide structure and is recrystallized. Recrystallization also anneals the n+ regions, such as the NMOS source and drain. The PMOS source and drain are then formed by updiffusion from the doped regions, aligned with the gate electrode and gate dielectric.

In still another aspect, the present invention is a process for forming a pair of stacked MOSFETs having a common gate electrode and comprises: forming an NMOS FET including source, drain and gate electrode; depositing a first conformal undoped oxide layer on the NMOS FET structure; depositing a second layer of conformal oxide on the first layer, the second layer being p-type doped and when combined with the first layer forms regions of the second layer on opposite sides of the gate electrode; depositing a sacrificial planarizing layer over the doped second layer; etching the sacrificial layer and the oxide layers at equal rates until the upper surface of the gate electrode is exposed and defines isolated p-type glass regions on opposite sides of the gate electrode; selectively forming a gate oxide by oxidizing the upper surface of the gate electrode; forming a polysilicon layer over the doped glass regions and the gate oxide; and heating the upper polysilicon layer to recrystallize the polysilicon and to updiffusing dopant from the glass layer into p-type source and drain regions which are aligned with the common gate electrode.

Alternatively, an oxide capping layer can be formed over the doped second layer prior to planarization to prevent premature outdiffusion.

DETAILED DESCRIPTION OF THE INVENTION

Figure 1:
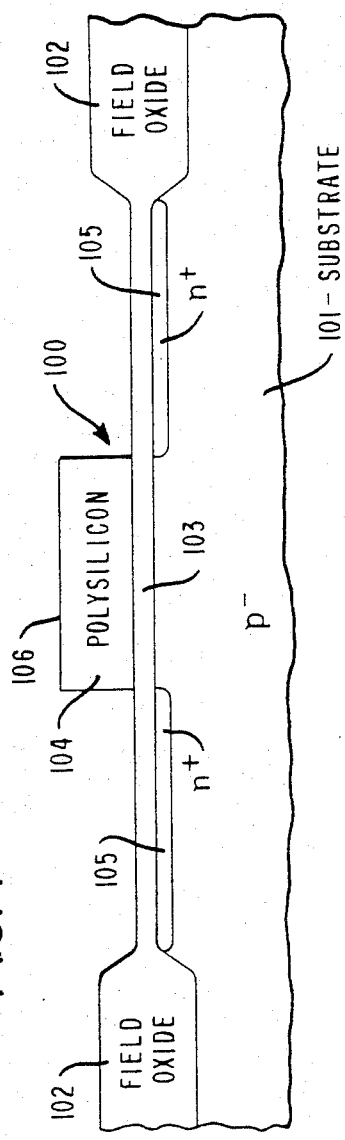
FIGS. 1 through 5 are schematic cross-sectional illustrations of a monolithic semiconductor integrated circuit taken sequentially during the course of fabricating a stacked MOSFET device using the process sequence of the present invention.

FIG. 1 illustrates the starting point for implementing the process sequence of the present invention. The starting structure includes a conventional self-aligned NMOS device 100 formed in a p-type silicon substrate 101. As is well known, one sequence for forming the NMOS structure involves the use of LOCOS techniques to define the thick field oxide regions 102 which separate the active device areas, growing the thin gate oxide 103, adjusting the threshold voltage of the n-channel device using a light boron ion implantation, and depositing and delineating the gate electrode 104 (poly I). Typically, the poly I layer is deposited to a thickness of about 500 nanometers using low pressure chemical vapor deposition (LPCVD), is doped using standard in situ doping techniques, and is masked and patterned to define the gate electrode 104. Then, a second doping is carried out to form the n+-type source and drain areas 105—105, thus doping preferably implemented by ion implementation.

Because the gate oxide for the upper device is to be formed on the upper surface 106 of the gate electrode 104, the poly I layer is deposited or upper surface is post-deposition treated to provide a topography which is free of surface asperities and spikes. One treatment involves oxidizing the upper surface 106 of the polysilicon 104 by subjecting the structure to a temperature of about 1,000° C. in a wet oxidizing ambient, to grow at least 20 nanometers of oxide on the poly I and, in so doing, to consume a surface layer of the poly I. CThen, the oxide is etched off using a conventional etchant, such as a buffered hydrogen flouride. The as-deposited thickness of the poly I layer may be increased to offset the amount consumption during this oxidation step. Typically, this surface treatment is done prior to patterning and doping of gate 104, but can be done after these steps if desired.

The poly I layer is next doped, masked and etched, using conventional n+-type implant doping, photolithographic mask formation and poly etching techniques, to form the polysilicon gate electrode 104. The gate electrode 104 is then doped, for example by phosphorus ion implantation with an energy of 100 Kev and a 1.4×10E16 dose.

Figure 2:
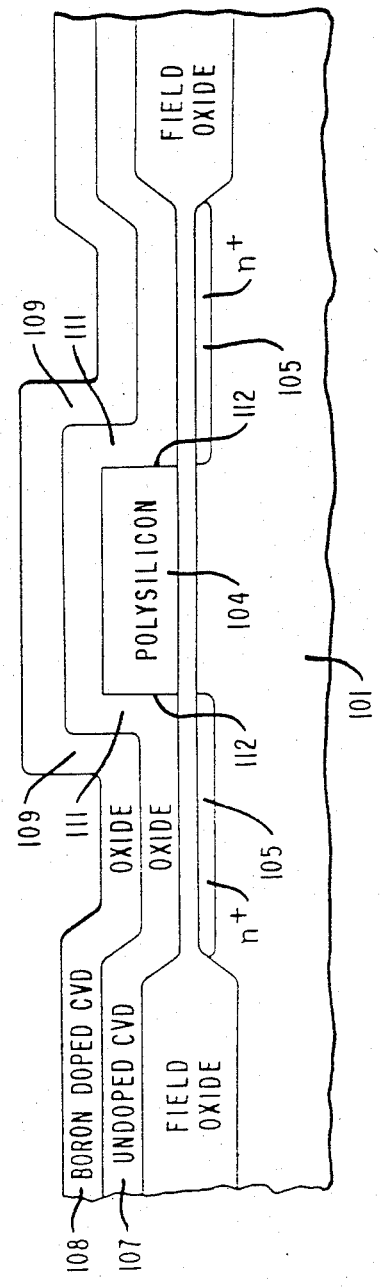
Figure 5:
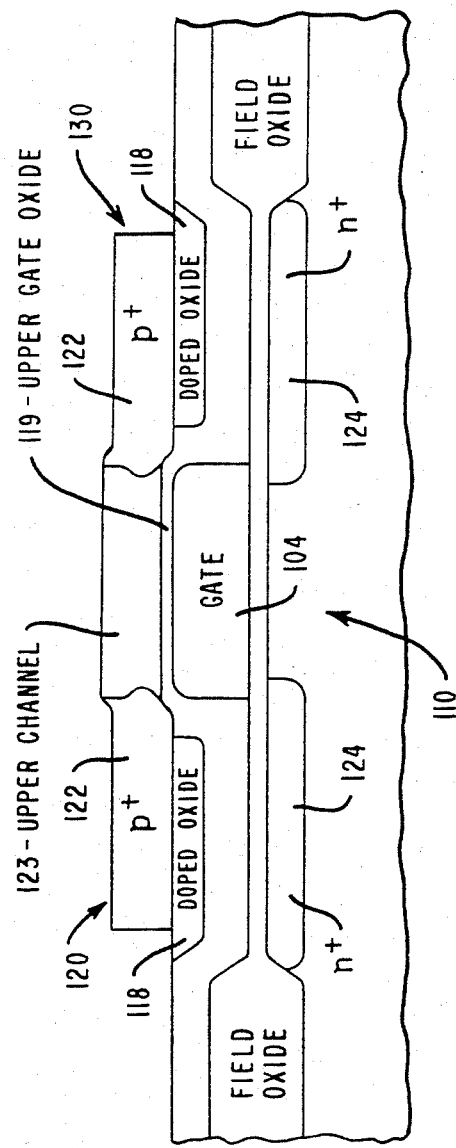

Referring next to the structure shown in FIG. 2, the initial steps of the unique process sequence according to the present invention are implemented by depositing undoped CVD silicon dioxide layer 107 conformally over the NMOS structure 100, followed by depositing a boron doped CVD silicon dioxide layer 108 conformally over layer 107. The layer 107 is the interlayer dielectric which electrically isolates the lower NMOS device 100 from the upper PMOS device 130 (FIG. 5). Heavily doped layer 108 serves as an impurity source for forming the self-aligned source and drain of upper device 130. It should be recognized that the boron diffuses laterally as well as vertically during the updiffusion step, thereby closing separation 111 between the doped glass 108 and the sidewalls 112 of gate electrode 104. Typically, the undoped oxide layer 107 is conformally deposited to a thickness of about 300 nanometers by LPCVD, (for example, 300 mT; 420° C.; silane and oxygen system). The doped oxide layer 108, commonly known as boron glass, can be formed, for example, by the same process as the layer 107, to a thickness of about 200 nanometers, and doped either during its formation, for example by using boron-nitride as a solid diffusion source (4BN+3O$_2$→2B$_2$O$_3$+2N$_2$↑) or by adding a gaseous boron dopant to the LPCVD system, or afterwards. A capping layer of undoped oxide having a thickness of 20-30 nanometers may be applied over the boron glass layer 108 to prevent outdiffusion prior to the poly II deposition.

To provide the aligned upper source and drain, advantage is taken of the "step" which is formed by the polysilicon gate electrode 104 relative to the substrate surface. Because of this step and the resulting stepped surface topography of conformal layers 107 and 109, these layers are relatively thin adjacent the edges of the gate electrode 104. As a consequence, the corresponding edges 109—109 of the doped oxide layer 108 are situated very close to the gate edges 112—112. In short, the boron doped CVD glass layer 108 is formed closely adjacent the gate electrode 104 so that during the subsequent formation of the source and drain of the upper PMOS device by updiffusion, this glass layer forms the source and drain closely adjacent the upper gate electrode, thereby providing alignment very similar to that provided by conventional self-aligned silicon technology.

Figure 3:
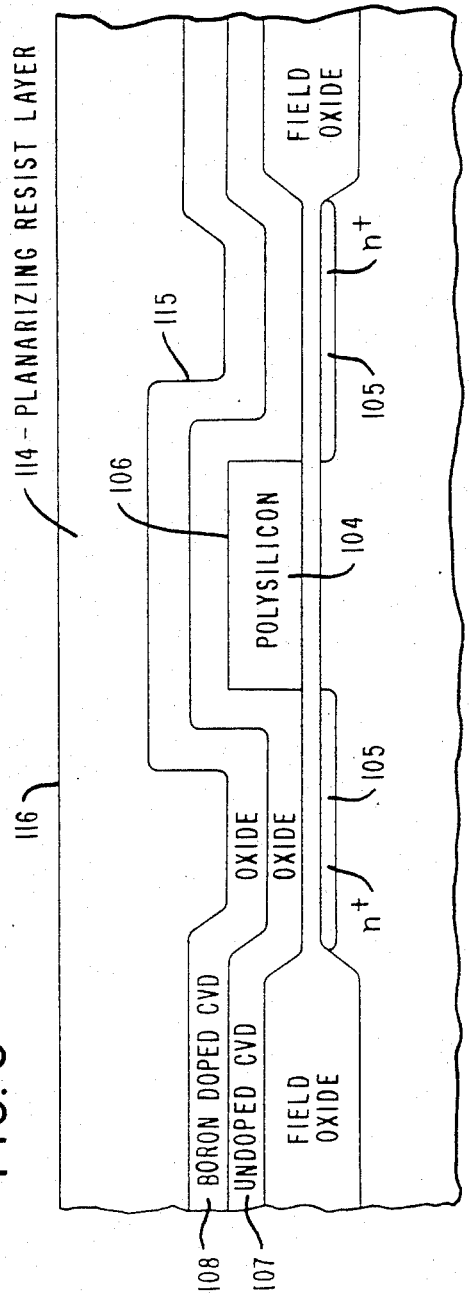

Referring now to FIG. 3, the next step is to planarize the oxide layers 107 and 108 and to expose the upper surface 106 of the gate electrode 104. One suitable technique involves the spin-on application of a relatively low viscosity organic layer 114 on outer surface 115 of oxide 108 The spun-on material is caused to flow to a relatively smooth surface 116 by the centrifugal force of the application or by a subsequent low temperature bake. Reactive ion etching, which etches the organic material and the oxides at approximately the same rate, is then used to clear the organic layer from the upper surface and replicate the surface smoothness 116 of the organic coating 114 in the resulting outer surface 117 of layers 107 and 108. See FIG. 4.

Representative planarizing techniques employing a spin-on photoresist deposition and a 1:1 photoresist-to-oxide etch operation are described in U.S. Pat. Nos. 4,025,411 and 4,407,851.

Figure 4:
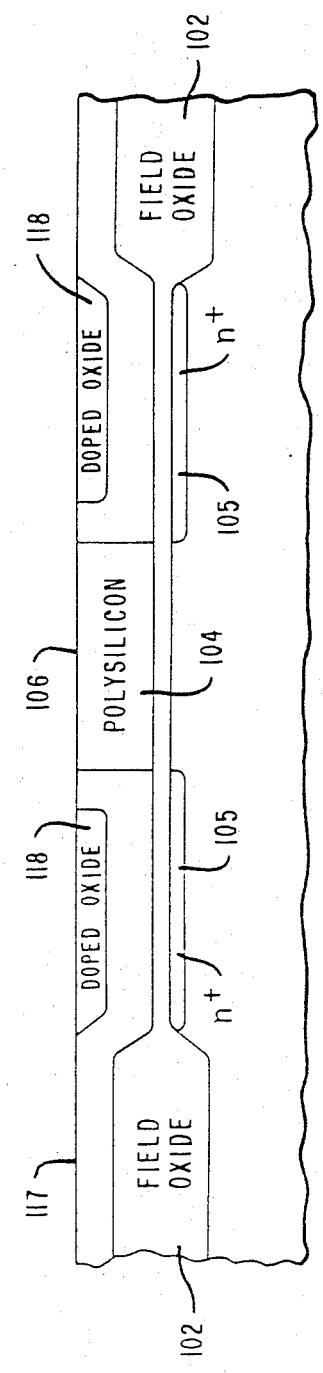

Referring further to FIG. 4, the planarization process completely removes oxide layers above the gate electrode 104 and above the field oxide down to the level of the surface 106 of the gate electrode 104, thereby precisely defining the boron glass regions 118—118 in the device active area adjacent the common gate electrode 104. The depth of the boron glass region 118—118, and its proximity to gate electrode 104, can be increased or decreased as desired by, respectively, decreasing or increasing the thickness of the underlying undoped CVD oxide layer 107. For the exemplary 300 nanometer thickness of oxide layer 107, the 200 nanometer thickness of doped glass layer 109, and for the 500 nanometer thickness of the electrode 104, the boron glass dopant source regions 118—118 are about 100-200 nanometers thick.

Referring now to FIG. 5, after the planarization sequence, a gate oxide layer 119 is selectively grown to a thickness of about 25-50 nanometers on the highly doped polysilicon, typically by dry oxidation at approximately 900° C. for 40 minutes, possibly with 3% by weight of HCl. The oxidation process proceeds much faster on the silicon gate electrode 104 than on the surrounding oxide, with the result that the upper gate oxide 119 is predominantly formed on the gate electrode. Also, it should be noted that some growth of oxide over regions 118—118 is not detrimental. In short, the gate oxide 119 is automatically formed self-aligned with the gate and the subsequently diffused PMOS source and drain regions.

Immediately after forming the gate oxide 119, and to avoid contamination of that oxide, a second polysilicon layer (poly II) is formed to a thickness of about 250-450 nanometers, again using conventional techniques such as LPCVD. The poly II layer is then lightly doped by ion implantation, for example with boron at an energy of 35 keV and a dose of 1E12-2E13, to provide the requisite channel inversion threshold in upper channel region 123. The poly II layer is then capped with an antireflective coating of nitride (not shown) which is formed about 40-45 nanometers thick by conventional processing such as LPCVD. Next, the poly II layer is for example exposed to a CW argon laser beam (backside temperature of 500° C.; spot size 50 micrometers; step size 15 micrometers; beam power 9 watts; scanning speed 55 cm/sec.) to convert the polysilicon to device-quality material comprising a recrystallized matrix of crystallites having various crystal orientations, and to simultaneously anneal the n-channel source and drain regions 105—105 (FIG. 4). This operation also redistributes the boron from doped oxide regions 118 into selected, self-aligned regions of the recrystallized poly II layer to form p-channel transistor source/drain regions 122—122. The nitride cap (not shown) is then removed using concentrated hydroflouric acid and the recrystallized poly II layer is patterned to the source 122 channel 123, and drain 122 configuration shown in FIG. 5.

If conventional stacked device technology were being used, the functionally similar operation would involve a masking of the channel, for example, using photoresist or silicon dioxide, and an implant of the PMOS source and drain regions. Such a process, however, would not provide alignment between the two stacked devices 110 and 130. In contrast, using the present invention, the integrated circuit is subjected to a thermal diffusion sequence, for example at approximately 900° C. for 30 minutes in steam to updiffuse boron dopant from regions 118—118 into the poly II layer to complete the formation of the source 122 and drain 122 for the upper, p-channel transistor in alignment with the gate electrode 104. The exact conditions are influenced by the presence and the thickness of any capping layer which may be formed over boron glass layer 108 to inhibit premature boron outdiffusion. This thermal drive-in also serves to diffuse and anneal the source and drain 105—105 of the n-channel transistor 110 to regions 124—124 as shown in FIG. 5.

In summary, the present invention uses a solid dopant source (regions 118—118, FIG. 4) both (1) to define the location of the gate oxide 119 of the upper device 130 in alignment with the common gate 104, and also (2) to form the source 122 and drain 122 of the upper device both in alignment with the upper device 130 gate oxide and common gate 104. The result is a completely aligned, stacked transistor device pair which is characterized by minimum gate to upper source and upper drain capacitance and is formed without the usual mask alignment sensitive photolithographic processes.

Based upon the above detailed description of the invention, those of usual skill in the art will readily derive alternatives within the scope of the following claims.

What is claimed is:

1. A process for forming a MOS device having a channel region which is situated above and is aligned with a gate electrode common to an underlying field effect transistor, comprising: forming a layer of conformal oxide on the structure; forming a layer of conformal doped oxide to position regions of the doped layer on opposite side of and adjacent to the common gate electrode; forming a layer of planarizing material having a substantially level outer surface over the doped oxide layer; etching the planarizing layer and the oxide layers at substantially the same rate to replicate the level outer surface in the oxide layers and to define doped oxide regions on opposite sides of the common gate electrode; oxidizing the upper surface of the common gate electrode to form an aligned gate oxide layer thereon for the inverted device; forming a recrystallized polysilicon source-channel-drain layer over the doped oxide regions and the gate oxide; and, heating the resulting structure to up-diffuse dopant from the doped oxide regions into the polysilicon layer to define source and drain regions therein aligned with the gate oxide of the inverted device and the common gate electrode.

2. A process for forming a pair of stacked MOSFETs having a common gate electrode, comprising: forming a lower MOSFET of a first conductivity type, including a source, a drain and the common gate electrode; forming a conformal undoped oxide layer on the first MOSFET; forming a layer of conformal doped oxide on the undoped oxide layer, the dopant being of the second conductivity type, and the overall thickness of the oxide layers being such that regions of the doped layer are formed adjacent the common gate electrode; forming a substantially level layer of planarizing material over the doped oxide layer; etching the planarizing layer and the oxide layers at substantially equal rates to replicate the level surface in the outer layers and to a level such that the planarizing layer is removed and the upper surface of the common gate electrode is exposed and doped oxide regions are defined adjacent the gate electrode; placing the resulting structure in an oxidizing ambient to form a gate oxide on the common gate electrode upper surface, selectively with respect to the adjacent oxide regions; forming a polysilicon layer over the doped oxide regions and the gate oxide; recrystallizing the polysilicon layer; and heating the resulting structure to diffuse dopant out of the doped oxide regions adjacent the polysilicon to define second conductivity type source and drain regions in the polysilicon, aligned with the common gate electrode and the gate oxide.

3. The process of claim 1 or 2, wherein the thickness of the first formed layer of conformal oxide is materially thinner than the thickness of the common gate electrode.

4. The process of claim 1 or 2, wherein the doped oxide regions defined with relation to the gate electrode overlie source and drain regions of the underlying field effect transistor.

5. The process of claim 3, wherein the step of recrystallizing the polysilicon simultaneously anneals the source and drain regions of the underlying field effect transistor and redistributes dopant from the doped oxide regions into the recrystallized polysilicon layer.

6. The process of claim 3, wherein, after forming the doped oxide layer, a capping layer is formed on the doped oxide layer to prevent outdiffusion of dopant therefrom, and wherein the capping layer is removed during the planarizing etch step.

7. A process for forming a pair of stacked MOSFETs having a common gate electrode, comprising: forming a lower NMOSFET including a source, a drain and the common gate electrode; growing a layer of conformal undoped oxide on the NMOSFET structure; growing a layer of oxide on the undoped oxide layer, the outer layer being doped with p-type dopant, and the thickness of the undoped and doped layers being selected so that regions of the doped layer on opposite sides of the gate electrode and adjacent thereto are below the outer surface of the gate electrode; forming an organic resist layer having a substantially planar outer surface over the doped oxide layer; etching the resist and the oxide layers at substantially equal rates for the purpose of replicating the planar outer surface of the organic resist layer in the oxide layers and to a level such that the resist is removed and the upper surface of the gate electrode is exposed and isolated p-type oxide regions are defined on opposite sides of the gate electrode; placing the resulting structure in an oxidizing ambient to form a gate oxide selectively on the exposed upper surface of the common gate electrode with respect to the adjacent oxide; forming a polysilicon layer over the p-type doped oxide regions and the gate oxide; doping the polysilicon layer to a suitable conductivity level for the channel of the upper MOSFET; patterning the polysilicon layer to form source, channel and drain regions; heating the polysilicon layer to recrystallize the polysilicon layer; and heating the resulting structure to diffuse p-type dopant from the p-type oxide regions therein on opposite sides of the MOSFET channel aligned with the upper MOSFET gate oxide and the common gate electrode.

8. The process of claim 7, wherein the p-type dopant is boron.

9. The process of claim 8, wherein the recrystallizing step simultaneously anneals the source and drain regions of the NMOSFET and redistributes boron from the boron doped oxide regions into the recrystallized polysilicon layer.

10. The process of claim 7, wherein, after forming the doped oxide layer, a capping layer is formed on the doped oxide layer to prevent outdiffusion of dopant, and wherein the capping layer is removed during the planarizing etching step.

* * * * *